(12) United States Patent
Tang et al.

(10) Patent No.: US 8,435,902 B2
(45) Date of Patent: May 7, 2013

(54) INVERTABLE PATTERN LOADING WITH DRY ETCH

(75) Inventors: Jing Tang, Santa Clara, CA (US); Nitin Ingle, San Jose, CA (US); Dongqing Yang, San Jose, CA (US); Shankar Venkataraman, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 341 days.

(21) Appl. No.: 12/959,155

(22) Filed: Dec. 2, 2010

(65) Prior Publication Data

US 2011/0230052 A1 Sep. 22, 2011

Related U.S. Application Data

(60) Provisional application No. 61/314,641, filed on Mar. 17, 2010.

(51) Int. Cl.
| H01L 21/302 | (2006.01) |
| H01L 21/461 | (2006.01) |
| H01L 21/311 | (2006.01) |
| C23F 3/00   | (2006.01) |

(52) U.S. Cl.
USPC ............ 438/723; 438/694; 438/695; 216/80

(58) Field of Classification Search .......... 438/694, 438/695, 702, 710, 723, 734; 216/51, 80
See application file for complete search history.

(56) References Cited

U.S. PATENT DOCUMENTS

| 5,888,906 | A  | 3/1999 | Sandhu et al. | |
| 6,796,314 | B1 | 9/2004 | Graff | |
| 7,488,688 | B2 | 2/2009 | Chung et al. | |
| 8,058,179 | B1* | 11/2011 | Draeger et al. | 438/714 |
| 8,187,486 | B1* | 5/2012 | Liu et al. | 216/79 |
| 2004/0110354 | A1 | 6/2004 | Natzle et al. | |
| 2005/0230350 | A1 | 10/2005 | Kao et al. | |
| 2007/0099438 | A1 | 5/2007 | Ye et al. | |
| 2007/0108404 | A1 | 5/2007 | Stewart et al. | |
| 2008/0182382 | A1 | 7/2008 | Ingle et al. | |
| 2008/0233709 | A1* | 9/2008 | Conti et al. | 438/424 |
| 2011/0053380 | A1* | 3/2011 | Sapre et al. | 438/715 |
| 2011/0266252 | A1* | 11/2011 | Thadani et al. | 216/17 |

FOREIGN PATENT DOCUMENTS

WO  WO 2011/115761 A2  9/2011

OTHER PUBLICATIONS

"Applied Siconi™ Preclean," Applied Materials, Inc., pp. 1-8, printed Aug. 7, 2009.

"Silicon-Selective Dry Etch for Carbon-Containing Films," U.S. Appl. No. 12/551,180, filed Aug. 31, 2009.

(Continued)

*Primary Examiner* — Allan Olsen
*Assistant Examiner* — Margaret D Klunk
(74) *Attorney, Agent, or Firm* — Kilpatrick Townsend & Stockton LLP

(57) ABSTRACT

A method of etching silicon oxide from a narrow trench and a wide trench (or open area) is described which allows the etch in the wide trench to progress further than the etch in the narrow trench. The method includes two dry etch cycles. The first dry etch cycle involves a low intensity or abbreviated sublimation step which leaves solid residue in the narrow trench. The remaining solid residue inhibits etch progress in the narrow trench during the second dry etch cycle allowing the etch in the wide trench to overtake the etch in the narrow trench.

13 Claims, 7 Drawing Sheets

OTHER PUBLICATIONS

"Smooth Siconi Etch for Silicon-Containing Films," U.S. Appl. No. 12/646,030, filed Dec. 23, 2009.
Notification of Transmittal of the International Search Report and the Written Opinion of the International Searching Authority, or the Declaration; International Search Report and Written Opinion of the International Searching Authority for corresponding International Application No. PCT/US2011/027221 mailed on Nov. 1, 2011, 8 pages.

* cited by examiner

INVERTABLE PATTERN LOADING WITH DRY ETCH

CROSS-REFERENCES TO RELATED APPLICATIONS

This application claims the benefit of U.S. Prov. Pat. App. No. 61/314,641 filed Mar. 17, 2010, and titled "INVERTABLE PATTERN LOADING WITH SICONI ETCH," which is incorporated herein by reference for all purposes.

BACKGROUND OF THE INVENTION

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective to the first material. As a result of the diversity of materials, circuits and processes, etch processes have been developed with a selectivity towards a variety of materials.

A Siconi™ etch is a remote plasma assisted dry etch process which involves the simultaneous exposure of a substrate to $H_2$, $NF_3$ and $NH_3$ plasma effluents. Remote plasma excitation of the hydrogen and fluorine species allows plasma-damage-free substrate processing. The Siconi™ etch is largely conformal and selective towards silicon oxide layers but does not readily etch silicon regardless of whether the silicon is amorphous, crystalline or polycrystalline. The selectivity provides advantages for applications such as shallow trench isolation (STI) and inter-layer dielectric (ILD) recess formation.

The Siconi™ process produces solid by-products which grow on the surface of the substrate as substrate material is removed. The solid by-products are subsequently removed via sublimation when the temperature of the substrate is raised. However, open areas and wide trenches generally etch at a slower rate than narrow trenches due to the greater amount of silicon oxide which must be consumed. Pattern-related differences, such as these, are referred to as pattern loading effects (PLE).

Due to these constraints, methods are needed to provide greater flexibility in the pattern loading effect (PLE) associated with the Siconi™ etch.

BRIEF SUMMARY OF THE INVENTION

A method of etching silicon oxide from a narrow trench and a wide trench (or open area) is described which allows the etch in the wide trench to progress further than the etch in the narrow trench. The method includes two dry etch cycles. The first dry etch cycle involves a low intensity or abbreviated sublimation step which leaves solid residue in the narrow trench. The remaining solid residue inhibits etch progress in the narrow trench during the second dry etch cycle allowing the etch in the wide trench to overtake the etch in the narrow trench.

Embodiments of the invention include methods of etching silicon oxide from both a narrow trench and a wide trench on a surface of a patterned substrate in a substrate processing region of a substrate processing chamber. The methods include flowing a fluorine-containing precursor and a hydrogen-containing precursor into a remote plasma region fluidly coupled to the substrate processing region while forming a plasma in the remote plasma region to produce plasma effluents. The methods further include etching the silicon oxide in each of the narrow trench and the wide trench by flowing the plasma effluents into the substrate processing region and forming solid by-products on the surface of a remaining silicon oxide in the narrow trench and the wide trench. The solid by-products over the narrow trench are taller than solid by-products over the wide trench. The methods further include performing a partial sublimation, wherein the solid by-products of the wide trench are removed while the solid by-products of the narrow trench are only partially removed to form residual solid by-product in the narrow trench. The methods further include flowing the plasma effluents into the substrate processing region again to remove silicon oxide from the wide trench at a linear rate greater than that of the narrow trench due to the residual solid by-products. The methods further include performing a full sublimation, wherein the residual solid by-products are removed from the narrow trench.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

A method of etching silicon oxide from a narrow trench and a wide trench (or open area) is described which allows the etch in the wide trench to progress further than the etch in the narrow trench. The method includes two dry etch cycles. The first dry etch cycle involves a low temperature and/or abbreviated sublimation step which leaves solid residue in the narrow trench. The remaining solid residue inhibits etch progress in the narrow trench during the second dry etch cycle allowing the etch in the wide trench to overtake the etch in the narrow trench.

Figure 1A:
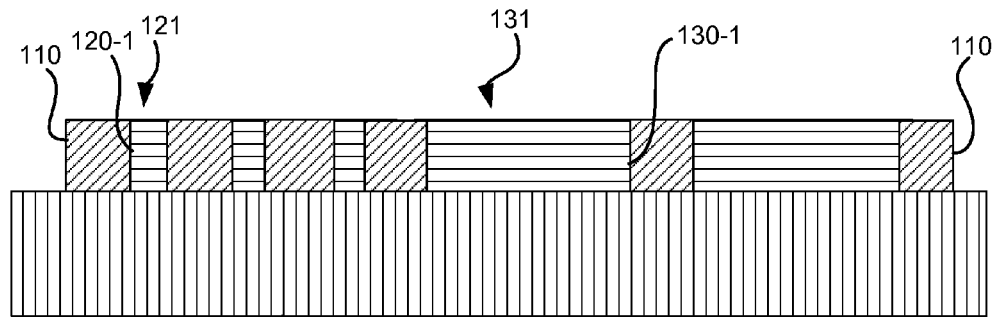
FIGS. 1A-1C depict a heterogeneously patterned surface during a standard Siconi™ etch process.

Siconi™ etch processes are an example of a dry etch process and have used a hydrogen source of ammonia ($NH_3$) and a fluorine source of nitrogen trifluoride ($NF_3$) which together flow into a remote plasma system (RPS). The plasma effluents created therein are flowed into a substrate processing region. A pattern loading effect may be observed when Siconi™ etch processes are applied to patterned wafers. FIG. 1A depicts a heterogeneously patterned substrate having a base substrate 100 and structural material 110. Structural material 110 defines both narrow trenches 121 and wide trenches 131 which are both filled with silicon oxide 120-1, 130-1. Structural material 110 may be any material which etches slowly relative to silicon oxide and may include silicon nitride or silicon. Exposing the patterned substrate of FIG. 1A to a Siconi™ etch typically results in a more rapid etch of the silicon oxide 120-1 in the narrow trenches 120 compared to the silicon oxide 130-1 in the wide trenches 131. This may occur because plasma effluents near narrow trench 121 are consumed at a lower rate than plasma effluents near wide trench 131 due to the greater amount of silicon oxide 130-1 to remove within wide trench 131.

Solid residue 125,135 is formed within each of narrow trench 121 and wide trench 131 and contains by product materials from reaction of plasma effluents and the silicon oxide 120-1, 130-1. The solid residue 125 may be described herein as "in" a trench but it is to be understood that the residue may extend above the walls of a trench as shown in narrow trench 121. The greater etch rate in combination with the narrower wall spacing results in taller solid residue 125 in narrow trench 121 relative to shorter solid residue 135 in wide trench 131. A full sublimation removes both the taller solid residue 125 and the shorter solid residue 135 by applying a relatively high temperature and/or a relatively lengthy heat treatment. The full sublimation exposes narrow silicon oxide 120-2 in narrow trench 121 and wide silicon oxide 130-2 in wide trench 131. The height of narrow silicon oxide 120-2 may be less than the height of wide silicon oxide 130-2 due to the etch rate variability described earlier.

Figure 1B:
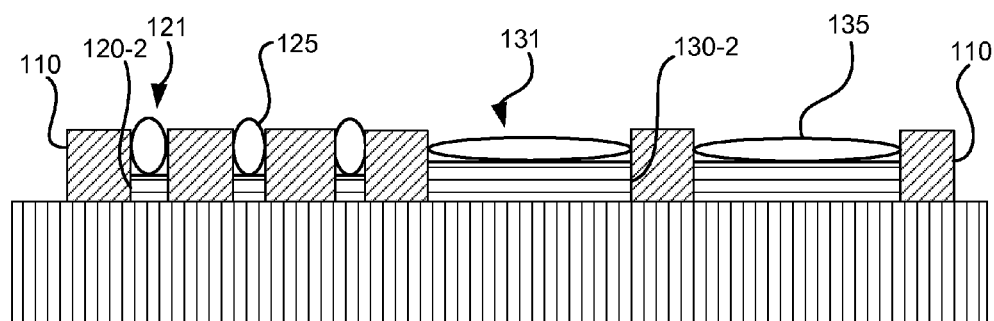
Figure 1C:
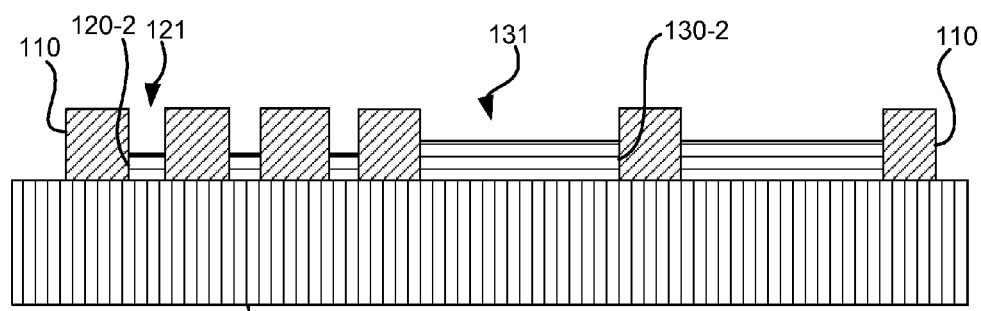
Figure 2:
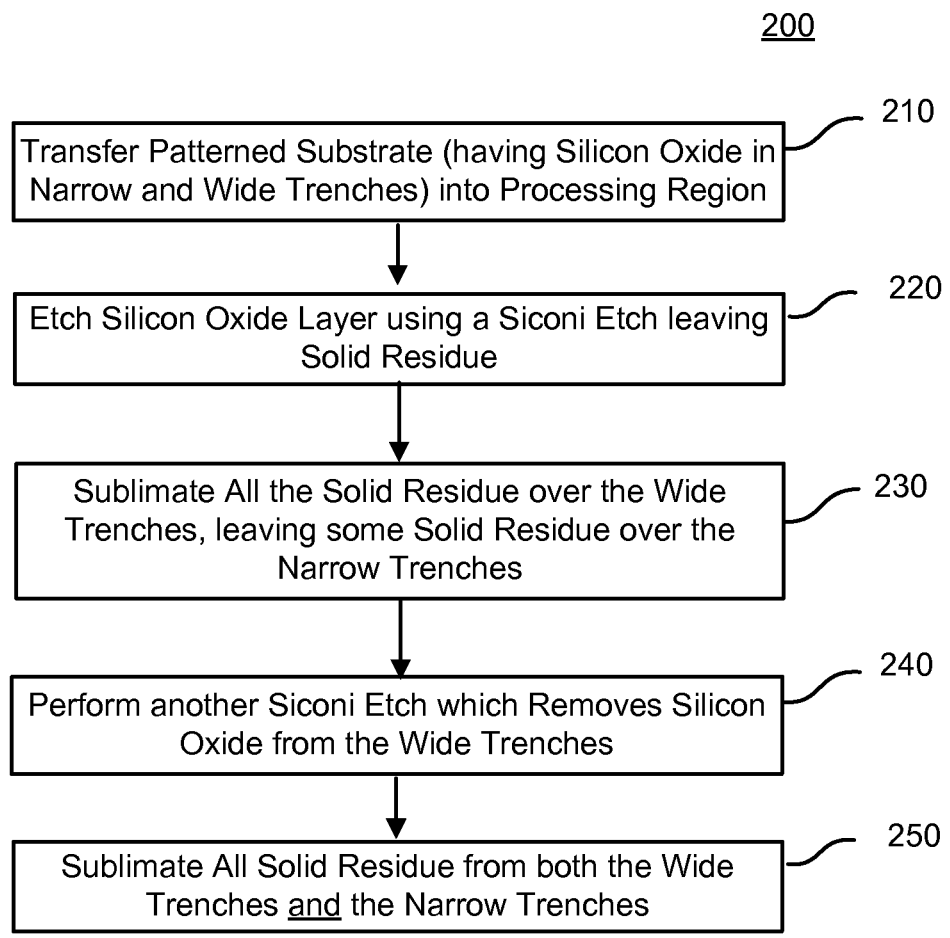
FIG. 2 is a flow chart of a silicon oxide etch process according to disclosed embodiments.

In order to better understand and appreciate the invention, reference is now made to FIGS. 2 and 3 which are a flow chart of an invertable pattern loading Siconi™ etch process applied to a patterned substrate and depictions of the patterned substrate during the process, respectively, according to disclosed embodiments. The process begins when a patterned substrate having narrow silicon oxide 320-1 in narrow trenches 321 and wide silicon oxide 330-1 in wide trenches 331 is transferred into a processing chamber (operation 210, FIG. 3A). Flows of ammonia and nitrogen trifluoride are initiated into a plasma region separate from the processing region (operation 220). The separate plasma region may be referred to as a remote plasma region herein and may be a distinct module from the processing chamber or a compartment within the processing chamber separated from the substrate processing region by a showerhead. Plasma effluents created in the remote plasma region travel into the substrate processing region to interact with the patterned substrate. The interaction forms narrow solid residue 325 in narrow trench 321 and wide solid residue 335 in wide trench 331 (see FIG. 3B). The formation of solid residues 325,335 consumes a portion of narrow silicon oxide 320-1 and wide silicon oxide 330-1 because the solid residue are by product materials from reaction of plasma effluents and the silicon oxide. The leftover portions of silicon oxide include narrow silicon oxide 320-2 and wide silicon oxide 330-2. Note that the height of narrow silicon oxide 320-2 is less than that of wide silicon oxide 330-2 due to the difference in material consumed as explained with reference to FIG. 1. The temperature of the silicon oxide during the interaction with the plasma effluents may be below one of 60° C., 50° C., 40° C. or 35° C., in different embodiments.

Figure 3A:
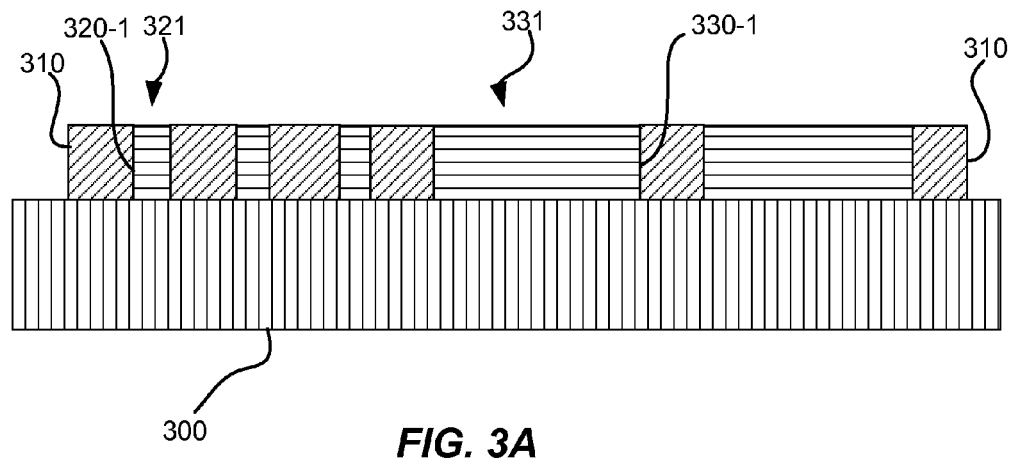
FIGS. 3A-3G depict a heterogeneously patterned surface during an invertable pattern loading Siconi™ according to disclosed embodiments.
Figure 3B:
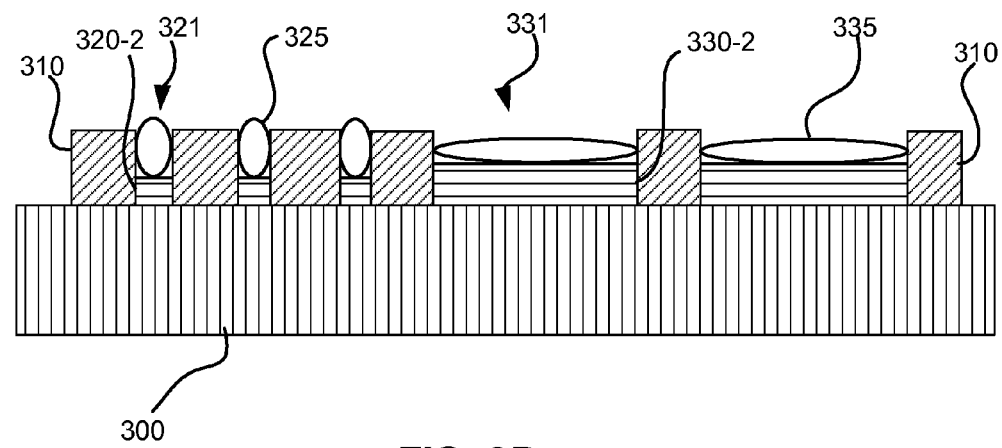
Figure 3C:
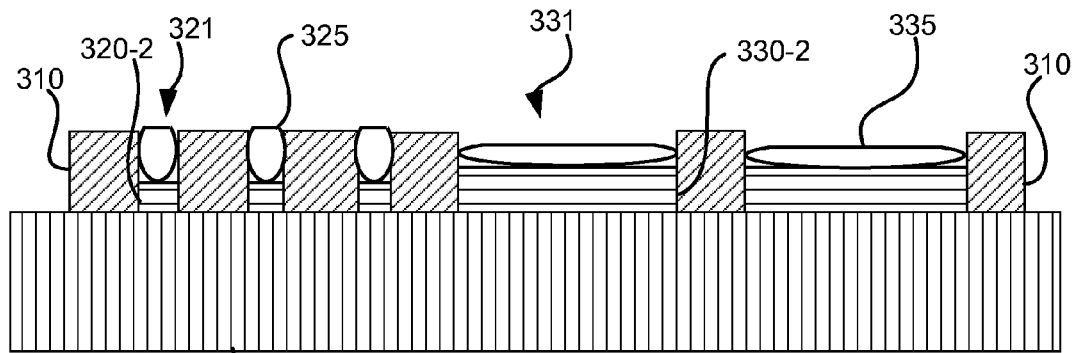
Figure 3D:
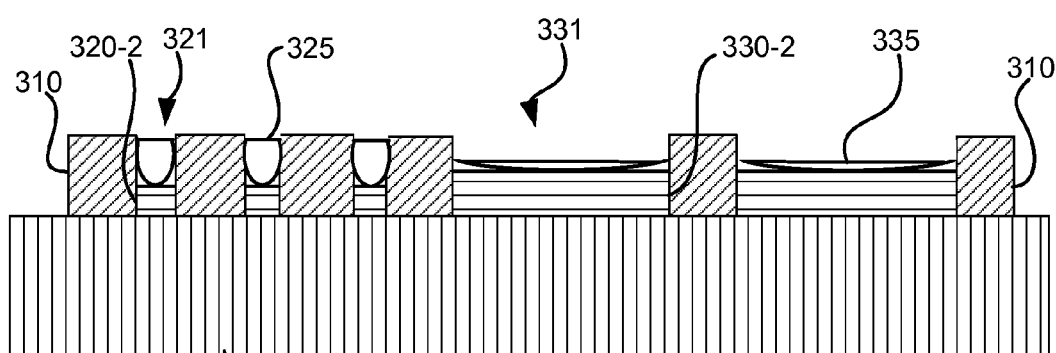
Figure 3E:
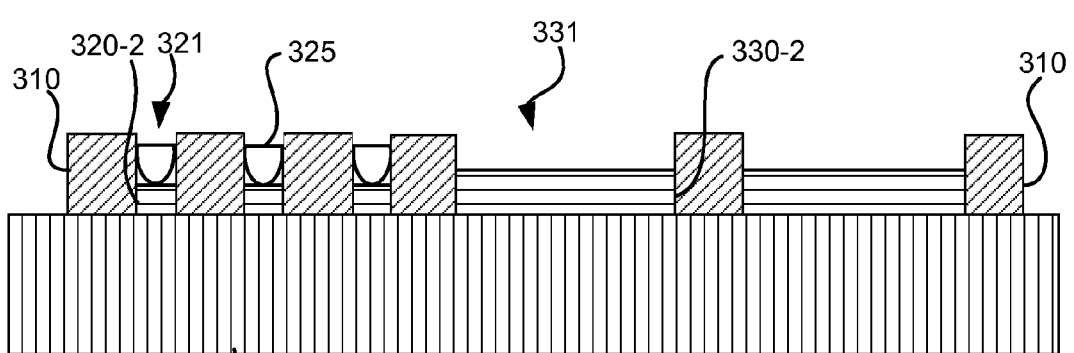
Figure 3F:
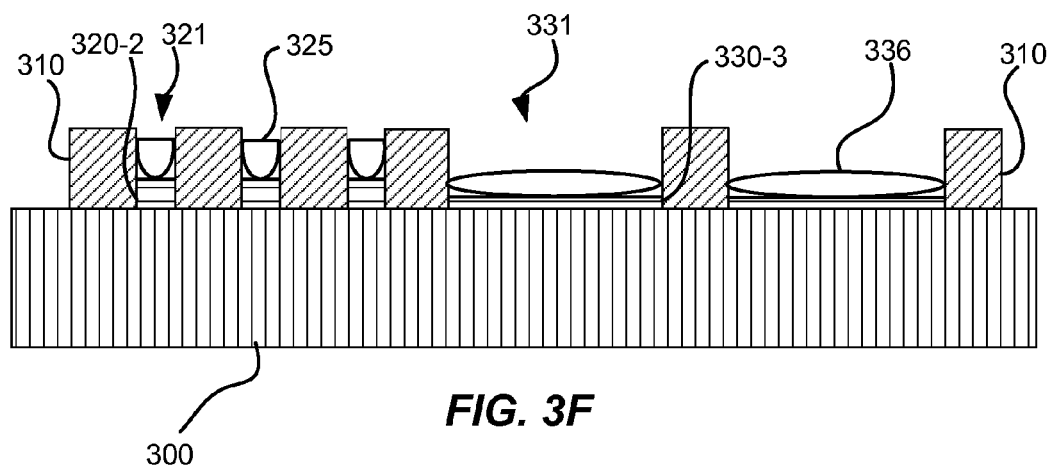
Figure 3G:
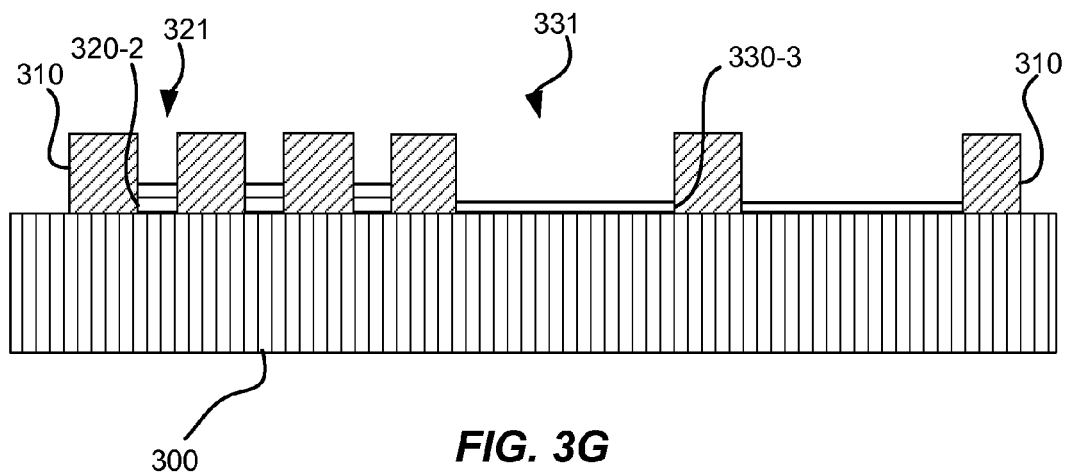

The substrate is heated to sublimate the solid by-products (operation 230) and the progress is shown in each of FIGS. 3C-3E. Each of narrow solid residue 325 and wide solid residue 335 are removed at roughly the same linear rate due to the nature of the sublimation process. Since wide solid residue 335 is shorter than narrow solid residue 325, a portion of narrow solid residue 325 remains when wide solid residue 335 has been essentially removed from the top of wide silicon oxide 330-2. As a result of the incomplete removal of narrow solid residue 325, the process may be referred to herein as a partial sublimation. A partial sublimation may be effected by shortening the duration of a sublimation and/or lowering the temperature of the sublimation. The temperature of the solid residue and the silicon oxide may be raised above one of 90° C., 100° C., 120° C. or 140° C. during the partial sublimation, in different embodiments. The duration of the sublimation may be below one of 45 seconds, 30 seconds, 20 seconds, 15 seconds or 10 seconds, in different embodiments. Wide solid residue 335 is said to be essentially removed to allow for some remnants which do not interfere with the greater etch rate of wide silicon oxide 330-2 relative to narrow silicon oxide 320-2 during subsequent processing.

The patterned wafer is again exposed to the plasma effluents in order to consume additional silicon oxide (operation 240). During this exposure, however, the plasma effluents have greater access to wide silicon oxide 330-2 and comparatively less access to narrow silicon oxide 320-2 due to solid residue 325 remaining on narrow silicon oxide 320-2 (see FIG. 3F). The obstruction provided by solid residue 325 allows the etch to proceed more rapidly (as measured linearly in the vertical direction) through wide silicon oxide 330-2. Following this etch process (operation 240) the height of wide silicon oxide 330-3 is less than the height of narrow silicon oxide 320-2. This relationship may be referred to herein as inverted pattern loading. Note that a relatively small amount of narrow silicon oxide 320-2 may be consumed in this secondary etch process, in embodiments, despite the use of the same figure identifier. Again, the temperature of the silicon oxide during the exposure to the plasma effluents may be below one of 60° C., 50° C., 40° C. or 35° C., in different embodiments.

The solid residue is sublimated again in operation 250. During this sublimation, however, essentially all wide solid residue 336 and narrow solid residue 325 are removed (to create the configuration shown in FIG. 3G). The net effect of operations 210-250 is to form wide silicon oxide 330-3 which is shorter than narrow silicon oxide 320-2. This relationship is contrary to the natural tendencies of the Siconi™ etch process and is dubbed an inverted pattern loading effect (PLE). The temperature of the solid residue and the silicon oxide may be raised above one of 90° C., 100° C., 120° C. or 140° C. during the full sublimation, in different embodiments. The duration of the sublimation may be above one of 45 seconds, 60 seconds, 75 seconds, 90 seconds or 120 seconds, in different embodiments. The full sublimation is longer than the partial sublimation, in some embodiments, while the temperature of the substrate is higher during the full sublimation in others.

Generally speaking, operations 220 and 230 may be repeated in an alternating manner to achieve different effective etch rates for each of the wide silicon oxide and the narrow silicon oxide. Altering the flow rates of the plasma effluents and the durations of the etch process also provide flexibility in choosing the amount of inversion for the pattern loading effect, in embodiments. A variety of precursors may be used to create plasma effluents as described herein. A fluorine-containing precursor may be combined with a hydrogen-containing precursor in the remote plasma region to form the plasma effluents used for the etch processes. The fluorine-containing precursor may include one or more of nitrogen trifluoride, hydrogen fluoride, diatomic fluorine, monatomic fluorine and fluorine-substituted hydrocarbons. The hydrogen-containing precursor may include one or more of atomic hydrogen, molecular hydrogen, ammonia, a hydrocarbon and an incompletely halogen-substituted hydrocarbon.

The width of narrow trenches may be less than one of 35 nm, 30 nm, 25 nm, 20 nm or 15 nm, in different embodiments. The width of wide trenches may be greater than one of 75 nm, 100 nm, 150 nm, 200 nm or 500 nm, in different embodiments. The term "wide trench" as used herein includes open areas or peripheral areas of integrated circuits during formation which may even be up to or much larger than tens or hundreds of microns.

Additional invertable pattern loading dry etch process parameters are disclosed in the course of describing an exemplary processing system.

Exemplary Processing System

Figure 4:
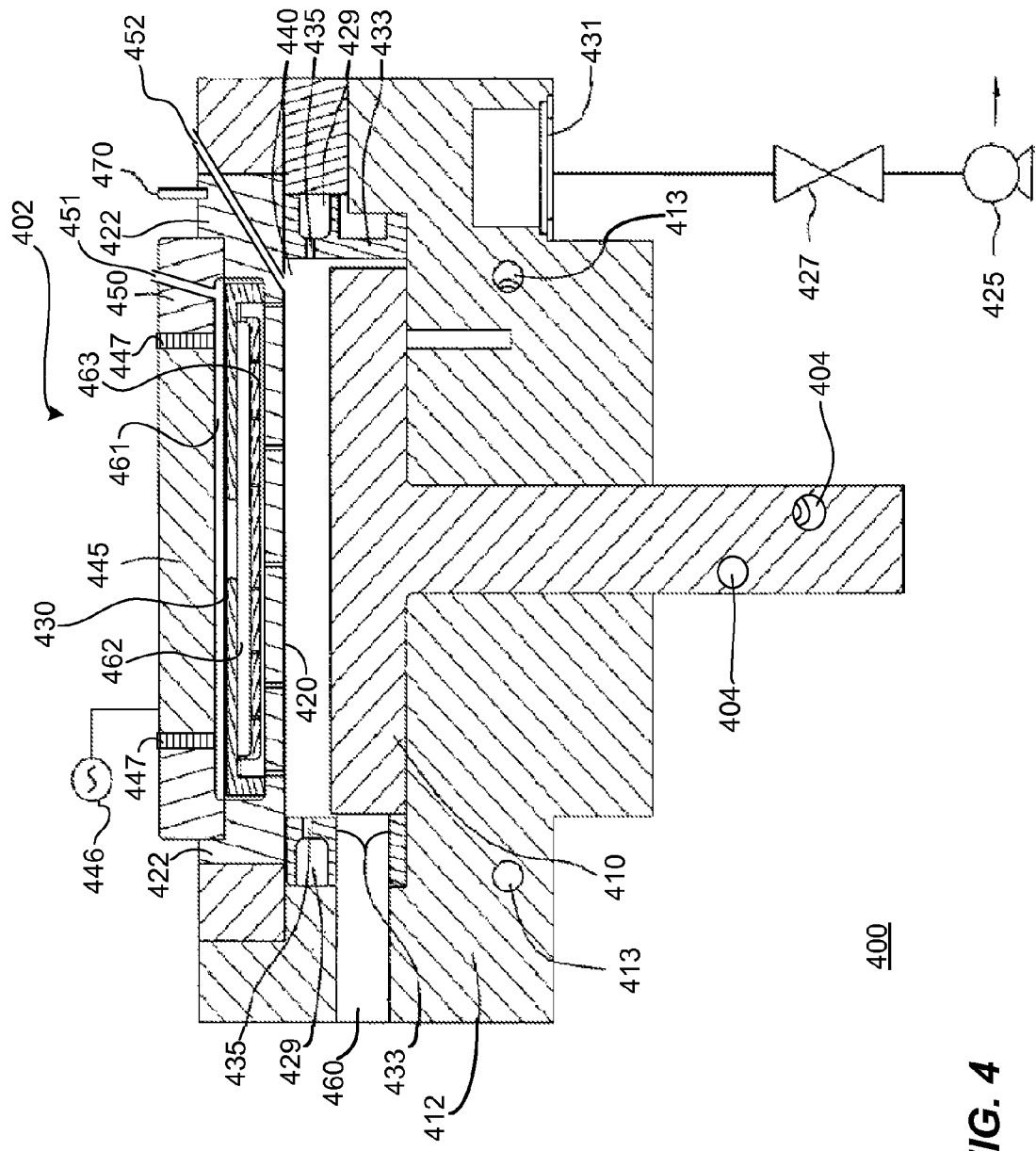
FIG. 4 is a cross-sectional view of a processing chamber for performing etch processes according to disclosed embodiments.

FIG. 4 is a partial cross sectional view showing an illustrative processing chamber 400, in which, embodiments of the invention may be carried out. Generally, a hydrogen-containing precursor and a fluorine-containing precursor may be introduced through one or more apertures 451 into remote plasma region(s) 461-463 and excited by plasma power source 446.

In one embodiment, the processing chamber 400 includes a chamber body 412, a lid assembly 402, and a support assembly 410. The lid assembly 402 is disposed at an upper end of the chamber body 412, and the support assembly 410 is at least partially disposed within the chamber body 412. The processing chamber 400 and the associated hardware are preferably formed from one or more process-compatible materials (e.g. aluminum, stainless steel, etc.).

The chamber body 412 includes a slit valve opening 460 formed in a sidewall thereof to provide access to the interior of the processing chamber 400. The slit valve opening 460 is selectively opened and closed to allow access to the interior of the chamber body 412 by a wafer handling robot (not shown). In one embodiment, a wafer can be transported in and out of the processing chamber 400 through the slit valve opening 460 to an adjacent transfer chamber and/or load-lock chamber, or another chamber within a cluster tool. An exemplary cluster tool which may include processing chamber 400 is shown in FIG. 7.

In one or more embodiments, chamber body 412 includes a chamber body channel 413 for flowing a heat transfer fluid through chamber body 412. The heat transfer fluid can be a heating fluid or a coolant and is used to control the temperature of chamber body 412 during processing and substrate transfer. Heating the chamber body 412 may help to prevent unwanted condensation of the gas or byproducts on the chamber walls. Exemplary heat transfer fluids include water, ethylene glycol, or a mixture thereof. An exemplary heat transfer fluid may also include nitrogen gas. Support assembly 410 may have a support assembly channel 404 for flowing a heat transfer fluid through support assembly 410 thereby affecting the substrate temperature.

The chamber body 412 can further include a liner 433 that surrounds the support assembly 410. The liner 433 is preferably removable for servicing and cleaning. The liner 433 can be made of a metal such as aluminum, or a ceramic material. However, the liner 433 can be any process compatible material. The liner 433 can be bead blasted to increase the adhesion of any material deposited thereon, thereby preventing flaking of material which results in contamination of the processing chamber 400. In one or more embodiments, the liner 433 includes one or more apertures 435 and a pumping channel 429 formed therein that is in fluid communication with a vacuum system. The apertures 435 provide a flow path for gases into the pumping channel 429, which provides an egress for the gases within the processing chamber 400.

The vacuum system can include a vacuum pump 425 and a throttle valve 427 to regulate flow of gases through the processing chamber 400. The vacuum pump 425 is coupled to a vacuum port 431 disposed on the chamber body 412 and therefore, in fluid communication with the pumping channel 429 formed within the liner 433. The terms "gas" and "gases" are used interchangeably, unless otherwise noted, and refer to one or more reactants, catalysts, carrier, purge, cleaning, combinations thereof, as well as any other fluid introduced into the chamber body 412. The term "precursor" is used to refer to any process gas which takes part in a reaction to either remove or deposit material from a surface.

Apertures 435 allow the pumping channel 429 to be in fluid communication with a processing region 440 within the chamber body 412. The processing region 440 is defined by a lower surface of the lid assembly 402 and an upper surface of the support assembly 410, and is surrounded by the liner 433. The apertures 435 may be uniformly sized and evenly spaced about the liner 433. However, any number, position, size or shape of apertures may be used, and each of those design parameters can vary depending on the desired flow pattern of gas across the substrate receiving surface as is discussed in more detail below. In addition, the size, number and position of the apertures 435 are configured to achieve uniform flow of gases exiting the processing chamber 400. Further, the aperture size and location may be configured to provide rapid or high capacity pumping to facilitate a rapid exhaust of gas from the chamber 400. For example, the number and size of apertures 435 in close proximity to the vacuum port 431 may be smaller than the size of apertures 435 positioned farther away from the vacuum port 431.

A gas supply panel (not shown) is typically used to provide process gas(es) to the processing chamber 400 through one or more apertures 451. The particular gas or gases that are used depend upon the process or processes to be performed within the chamber 400. Illustrative gases can include, but are not limited to one or more precursors, reductants, catalysts, carriers, purge, cleaning, or any mixture or combination thereof. Typically, the one or more gases introduced to the processing chamber 400 flow into plasma volume 461 through aperture(s) 451 in top plate 450. Alternatively or in combination, processing gases may be introduced more directly through aperture(s) 452 into processing region 440. Aperture(s) 452 bypass the remote plasma excitation and are useful for processes involving gases that do not require plasma excitation or processes which do not benefit from additional excitation of the gases. Electronically operated valves and/or flow control mechanisms (not shown) may be used to control the flow of gas from the gas supply into the processing chamber 400. Depending on the process, any number of gases can be delivered to the processing chamber 400, and can be mixed either in the processing chamber 400 or before the gases are delivered to the processing chamber 400.

The lid assembly 402 can further include an electrode 445 to generate a plasma of reactive species within the lid assembly 402. In one embodiment, the electrode 445 is supported by top plate 450 and is electrically isolated therefrom by inserting electrically isolating ring(s) 447 made from aluminum oxide or any other insulating and process compatible material. In one or more embodiments, the electrode 445 is coupled to a power source 446 while the rest of lid assembly 402 is connected to ground. Accordingly, a plasma of one or more process gases can be generated in remote plasma region composed of volumes 461, 462 and/or 463 between electrode 445 and annular mounting flange 422. In embodiments, annular mounting flange comprises or supports gas delivery plate 420. For example, the plasma may be initiated and maintained between electrode 445 and one or both blocker plates of blocker assembly 430. Alternatively, the plasma can be struck and contained between the electrode 445 and gas delivery plate 420, in the absence of blocker assembly 430. In either embodiment, the plasma is well confined or contained within the lid assembly 402. Accordingly, the plasma is a "remote plasma" since no active plasma is in direct contact with the substrate disposed within the chamber body 412. As a result, plasma damage to the substrate may be avoided since the plasma is separated from the substrate surface.

A wide variety of power sources 446 are capable of activating the hydrogen-containing precursor (e.g. ammonia) and the nitrogen-containing precursor (nitrogen trifluoride). For example, radio frequency (RF), direct current (DC), or microwave (MW) based power discharge techniques may be used. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into the chamber 400. Exemplary remote plasma generators are available from vendors such as MKS Instruments, Inc. and Advanced Energy Industries, Inc. In the exemplary processing system an RF power supply is coupled to electrode 445. A higher-power microwave power source 446 is beneficial in the event that reactive oxygen will also be produced using power source 446.

The temperatures of the process chamber body 412 and the substrate may each be controlled by flowing a heat transfer medium through chamber body channel 413 and support assembly channel 404, respectively. Support assembly channel 404 may be formed within support assembly 410 to facilitate the transfer of thermal energy. Chamber body 412 and support assembly 410 may be cooled or heated independently. For example, a heating fluid may be flown through one while a cooling fluid is flown through the other.

Other methods may be used to control the substrate temperature. The substrate may be heated by heating the support assembly 410 (or a portion thereof, such as a pedestal) with a resistive heater or by some other means. In another configuration, gas delivery plate 420 may be maintained at a temperature higher than the substrate and the substrate can be elevated in order to raise the substrate temperature. In this case the substrate is heated radiatively or by using a gas to conduct heat from gas delivery plate 420 to the substrate. The substrate may be elevated by raising support assembly 410 or by employing lift pins.

During the etch processes described herein, chamber body 412 may be maintained within an approximate temperature range of between 50° C. and 80° C., between 55° C. and 75° C. or between 60° C. and 70° C. in different embodiments. During exposure to plasma effluents and/or oxidizing agents, the substrate may be maintained below the temperatures given previously, between about 15° C. and about 50° C., between about 22° C. and about 40° C., or near 30° C. in different embodiments.

Plasma effluents include a variety of molecules, molecular fragments and ionized species. Currently entertained theoretical mechanisms of Siconi™ etching may or may not be entirely correct but plasma effluents are thought to include $NH_4F$ and $NH_4F.HF$ which react readily with low temperature substrates described herein. Plasma effluents may react with a silicon oxide surface to form $(NH_4)_2SiF_6$, $NH_3$ and $H_2O$ products. The $NH_3$ and $H_2O$ are vapors under the processing conditions described herein and may be removed from processing region 440 by vacuum pump 425. A thin continuous or discontinuous layer of $(NH_4)_2SiF_6$ solid by-products is left behind on the substrate surface.

Following exposure to plasma effluents and the associated accumulation of solid by-products, the substrate may be heated to remove the by-products. In embodiments, the gas delivery plate 420 is heatable by incorporating heating element 470 within or near gas delivery plate 420. The substrate may be heated by reducing the distance between the substrate and the heated gas delivery plate. The gas delivery plate 420 may be heated to between about 100° C. and 150° C., between about 110° C. and 140° C. or between about 120° C. and 130° C. in different embodiments. By reducing the separation between the substrate and the heated gas delivery plate, the substrate may be heated to above about 75° C., above about 90° C., above about 100° C. or between about 115° C. and about 150° C. in different embodiments. The heat radiated from gas delivery plate 420 to the substrate should be made sufficient to dissociate or sublimate solid $(NH_4)_2SiF_6$ on the substrate into volatile $SiF_4$, $NH_3$ and HF products which may be pumped away from processing region 440. Other methods of imparting heat to the substrate may also be used. Time and/or temperature may be reduced to change a full sublimation step to a partial sublimation step which then leaves solid residue in narrow trenches for an invertable pattern loading dry etch.

Nitrogen trifluoride (or another fluorine-containing precursor) may be flowed into remote plasma volume 461 at rates between about 5 sccm and about 200 sccm, between about 50 sccm and about 150 sccm or between about 75 sccm and about 125 sccm in different embodiments. Ammonia (or hydrogen-containing precursors in general) may be flowed into remote plasma volume 461 at rates between about 50 sccm and about 300 sccm, between about 75 sccm and about 250 sccm, between about 100 sccm and about 200 sccm or between about 120 sccm and about 170 sccm in different embodiments.

Combined flow rates of hydrogen-containing and fluorine-containing precursors into the remote plasma region may account for 0.05% to about 50% by volume of the overall gas mixture; the remainder being a carrier gas. In one embodiment, a purge or carrier gas is first initiated into the remote plasma region before those of the reactive gases to stabilize the pressure within the remote plasma region.

Production of the plasma effluents occurs within volumes 461, 462 and/or 463 by applying plasma power to electrode 445 relative to the rest of lid assembly 402. Plasma power can be a variety of frequencies or a combination of multiple frequencies. In the exemplary processing system the plasma is provided by RF power delivered to electrode 445. The RF power may be between about 1 W and about 1000 W, between about 5 W and about 600 W, between about 10 W and about 300 W or between about 20 W and about 100 W in different embodiments. The RF frequency applied in the exemplary processing system may be less than about 200 kHz, less than about 150 kHz, less than about 120 kHz or between about 50 kHz and about 90 kHz in different embodiments.

Processing region 440 can be maintained at a variety of pressures during the flow of ozone, oxygen, carrier gases and/or plasma effluents into processing region 440. The pressure may be maintained between about 500 mTorr and about 30 Torr, between about 1 Torr and about 10 Torr or between about 3 Torr and about 6 Torr in different embodiments. Lower pressures may also be used within processing region 440. The pressure may be maintained below or about 500 mTorr, below or about 250 mTorr, below or about 100 mTorr, below or about 50 mTorr or below or about 20 mTorr in different embodiments.

In one or more embodiments, the processing chamber 400 can be integrated into a variety of multi-processing platforms, including the Producer™ GT, Centura™ AP and Endura™ platforms available from Applied Materials, Inc. located in Santa Clara, Calif. Such a processing platform is capable of performing several processing operations without breaking vacuum.

Deposition chambers that may implement embodiments of the present invention may include dielectric etch chambers, high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers.

Figure 5:
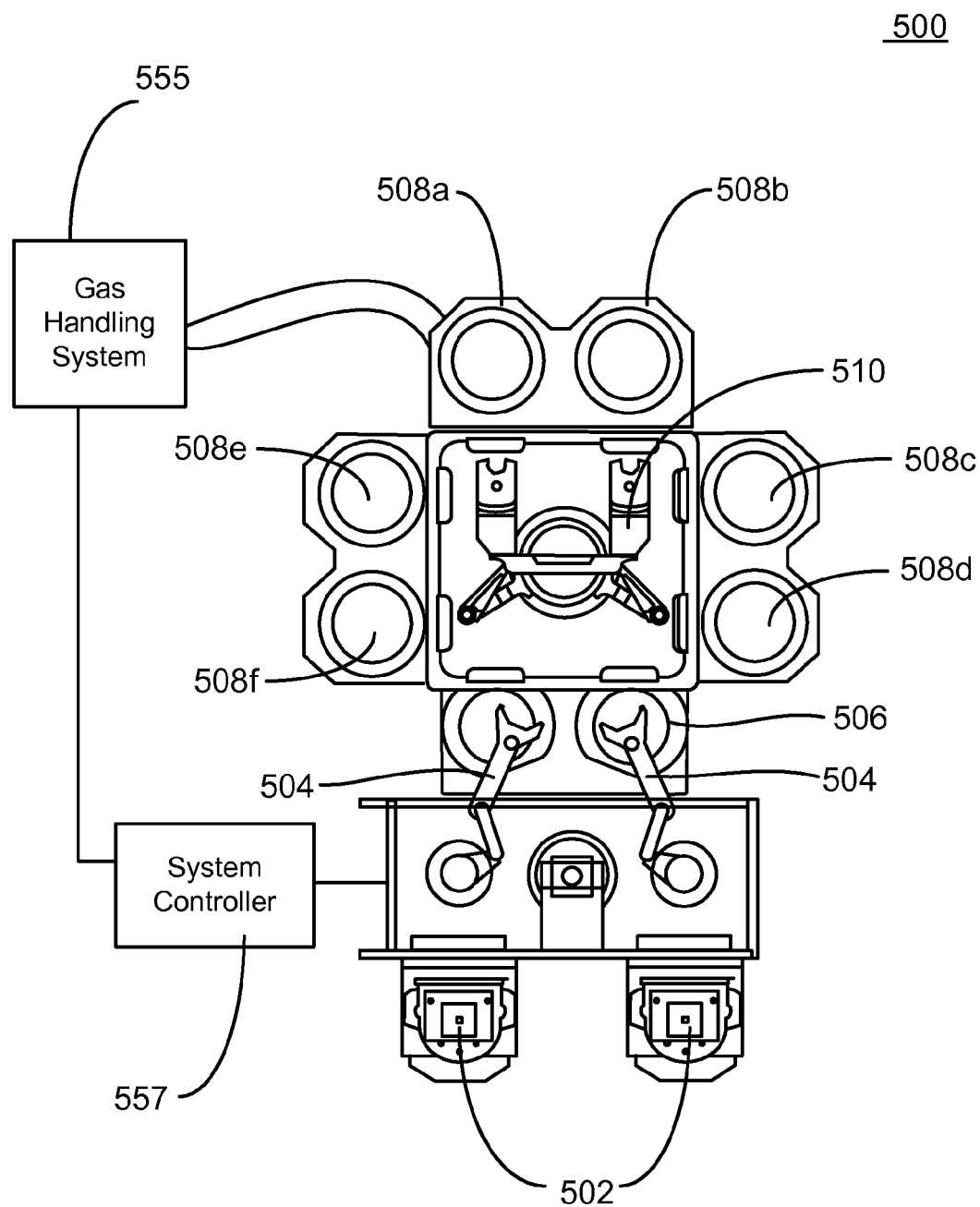
FIG. 5 is a processing system for performing etch processes according to disclosed embodiments.

Embodiments of the deposition systems may be incorporated into larger fabrication systems for producing integrated circuit chips. FIG. 5 shows one such system 500 of deposition, baking and curing chambers according to disclosed embodiments. In the figure, a pair of FOUPs (front opening unified pods) 502 supply substrate substrates (e.g., 300 mm diameter wafers) that are received by robotic arms 504 and placed into a low pressure holding area 506 before being placed into one of the wafer processing chambers 508a-f. A second robotic arm 510 may be used to transport the substrate wafers from the holding area 506 to the processing chambers 508a-f and back. Each processing chamber 508a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The processing chambers 508a-f may include one or more system components for depositing, annealing, curing and/or etching a flowable dielectric film on the substrate wafer. In one configuration, two pairs of the processing chamber (e.g., 508c-d and 508e-f) may be used to deposit dielectric material on the substrate, and the third pair of processing chambers (e.g., 508a-b) may be used to etch the deposited dielectric. In another configuration, all three pairs of chambers (e.g., 508a-f) may be configured to etch a dielectric film on the substrate. Any one or more of the processes described may be carried out on chamber(s) separated from the fabrication system shown in different embodiments.

System controller 557 is used to control motors, valves, flow controllers, power supplies and other functions required to carry out process recipes described herein. A gas handling system 555 may also be controlled by system controller 557 to introduce gases to one or all of the processing chambers 508a-f. System controller 557 may rely on feedback from optical sensors to determine and adjust the position of movable mechanical assemblies in gas handling system 555 and/or in processing chambers 508a-f. Mechanical assemblies may include the robot, throttle valves and susceptors which are moved by motors under the control of system controller 557.

In an exemplary embodiment, system controller 557 includes a hard disk drive (memory), USB ports, a floppy disk drive and a processor. System controller 557 includes analog and digital input/output boards, interface boards and stepper motor controller boards. Various parts of multi-chamber processing system 500 which contains processing chamber 400 are controlled by system controller 557. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for etching, depositing or otherwise processing a film on a substrate or a process for cleaning chamber can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. "Silicon oxide" may include minority concentrations of other elemental constituents such as nitrogen, hydrogen, carbon and the like. A gas may be a combination of two or more gases. The term "trench" is used throughout with no implication that the etched geometry has a large horizontal aspect ratio. Viewed from above the surface, trenches may appear circular, oval, polygonal, rectangular, or a variety of other shapes.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of etching silicon oxide from both a narrow trench and a wide trench on a surface of a patterned substrate in a substrate processing region of a substrate processing chamber, the method comprising:
    flowing a fluorine-containing precursor and a hydrogen-containing precursor into a remote plasma region fluidly coupled to the substrate processing region while forming a plasma in the remote plasma region to produce plasma effluents;
    etching the silicon oxide in each of the narrow trench and the wide trench by allowing the plasma effluents into the substrate processing region and forming solid by-products on the surface of a remaining silicon oxide in the narrow trench and the wide trench, wherein solid by-products over the narrow trench are taller than solid by-products over the wide trench;
    performing a partial sublimation, wherein the solid by-products of the wide trench are removed while the solid by-products of the narrow trench are only partially removed to form residual solid by-product in the narrow trench;
    flowing the plasma effluents into the substrate processing region again to remove silicon oxide from the wide trench at a linear rate greater than that of the narrow trench due to the residual solid by-products; and
    performing a full sublimation, wherein the residual solid by-products are removed from the narrow trench.

2. The method of claim 1 wherein an etch rate of the silicon oxide in the narrow trench is greater than that of the silicon oxide in the wide trench during the operation of etching the silicon oxide.

3. The method of claim 1 wherein a thickness of the silicon oxide in the narrow trench is greater than a thickness of the silicon oxide in the wide trench following the operation of performing a full sublimation.

4. The method of claim 1 wherein a width of the narrow trench is less than 35 nm.

5. The method of claim 1 wherein a width of the wide trench is greater than 75 nm.

6. The method of claim 5 wherein the wide trench is in one of an open area or a peripheral area of an integrated circuit during formation.

7. The method of claim 5 wherein the fluorine-containing precursor comprises at least one precursor selected from the group consisting of nitrogen trifluoride, hydrogen fluoride, diatomic fluorine, monatomic fluorine and fluorine-substituted hydrocarbons.

8. The method of claim 1 wherein the hydrogen-containing precursor comprises at least one precursor selected from the group consisting of atomic hydrogen, molecular hydrogen, ammonia, a hydrocarbon and an incompletely halogen-substituted hydrocarbon.

9. The method of claim 1 wherein the silicon oxide is maintained below 60° C. during the etching and flowing operations.

10. The method of claim 1 wherein the silicon oxide is raised above 90° C. during the operations of performing a partial sublimation and performing a full sublimation.

11. The method of claim 1 wherein a duration of the full sublimation is longer than a duration of the partial sublimation.

12. The method of claim 11 wherein the duration of the full sublimation is greater than 45 seconds.

13. The method of claim 11 wherein the duration of the partial sublimation is less than 30 seconds.

\* \* \* \* \*